United States Patent
Jacobs et al.

[11] 3,944,950
[45] Mar. 16, 1976

[54] QUASI-OPTICAL INTEGRATED CIRCUITS

[75] Inventors: Harold Jacobs, West Long Beach; Metro M. Chrepta, Neptune, both of N.J.

[73] Assignee: The United States of America as represented by the Secretary of the Army, Washington, D.C.

[22] Filed: Sept. 30, 1974

[21] Appl. No.: 510,526

Related U.S. Application Data

[60] Division of Ser. No. 397,184, Sept. 13, 1973, Pat. No. 3,866,143, and a continuation-in-part of Ser. No. 218,964, Jan. 19, 1972, abandoned.

[52] U.S. Cl. ......... 333/31 R; 307/299 R; 333/81 B; 333/95 R; 333/98 R; 350/96 WG
[51] Int. Cl.² .... H01P 1/18; H01P 1/32; H01P 3/20; H01P 9/00
[58] Field of Search .... 333/81 B, 95 R, 97 R, 98 R, 333/31 R; 350/96 WG; 307/88.3, 299; 331/96 R, 107 G; 357/17–19

[56] References Cited
UNITED STATES PATENTS

| | | | |
|---|---|---|---|
| 2,977,551 | 3/1961 | Gibson et al. | 333/81 B X |
| 3,327,247 | 6/1967 | Toda | 333/98 X |
| 3,356,866 | 12/1967 | Misawa | 331/96 X |
| 3,417,246 | 12/1968 | Hall | 357/18 X |

*Primary Examiner*—Alfred E. Smith
*Assistant Examiner*—Marvin Nussbaum
*Attorney, Agent, or Firm*—Nathan Edelberg; Robert P. Gibson; Daniel D. Sharp

[57] ABSTRACT

A quasi-optical integrated circuit which makes use of a high resistivity bulk single crystal intrinsic semiconductor as a low loss quasi-optical wave transmission medium for millimeter and submillimeter waves having one or more circuit elements or devices disposed either at or near the surface of a portion of the semiconductor, or formed within a portion of either the semiconductor transmission medium or a portion of a high resistivity single crystal intrinsic semiconductor appendage to said semiconductor transmission medium. By varying the potential applied to said elements or devices, one can control either the phase or the amplitude of quasi-optical wave propagation along the semiconductor waveguide; moreover, solid state devices such as quasi-optical generators, mixers and detectors can be formed within the semiconductor wave transmission medium itself. Quasi-optical generators also can be obtained by inserting a negative resistance device in an aperture disposed within a cavity resonator which is made of a material of high dielectric constant and high resistivity.

19 Claims, 27 Drawing Figures

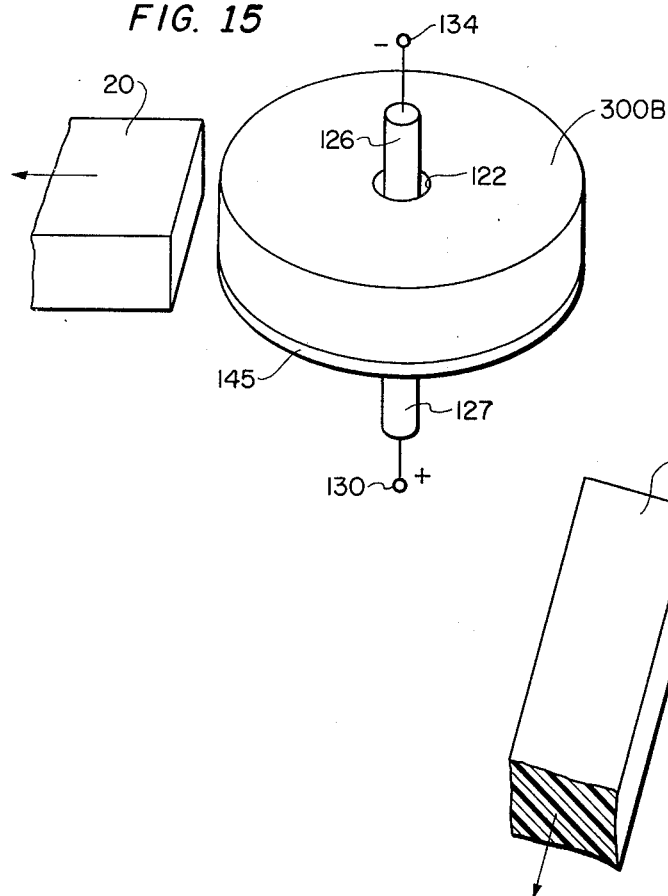
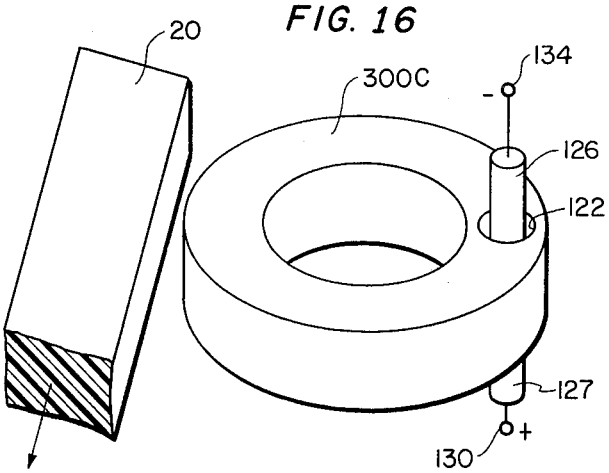
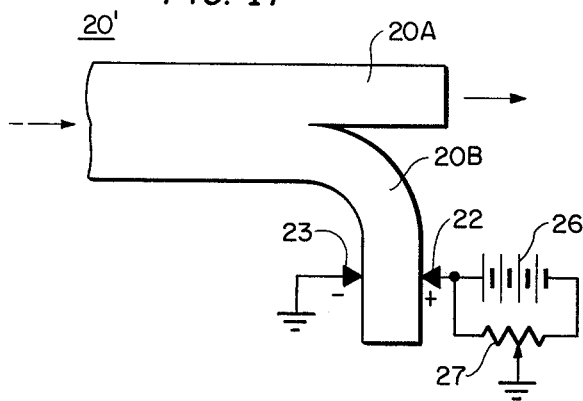
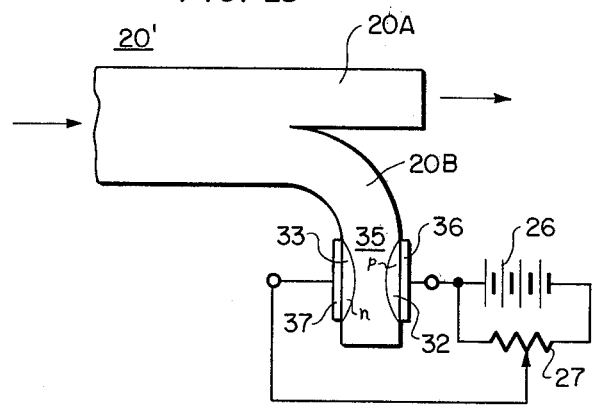
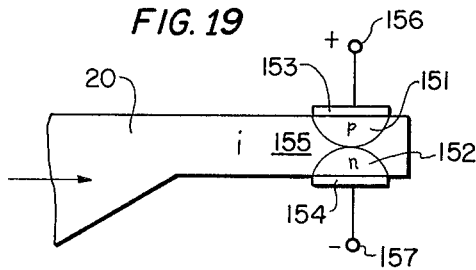

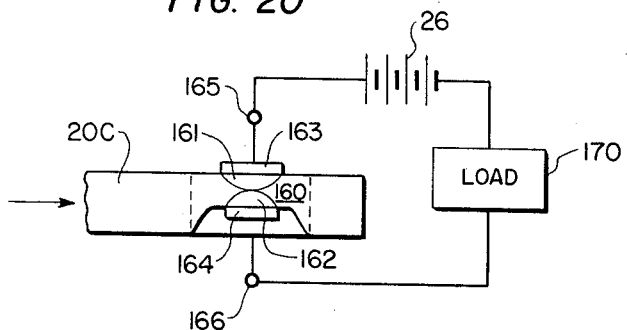
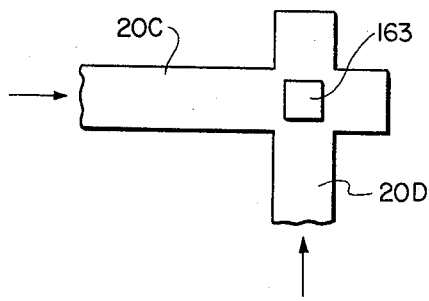
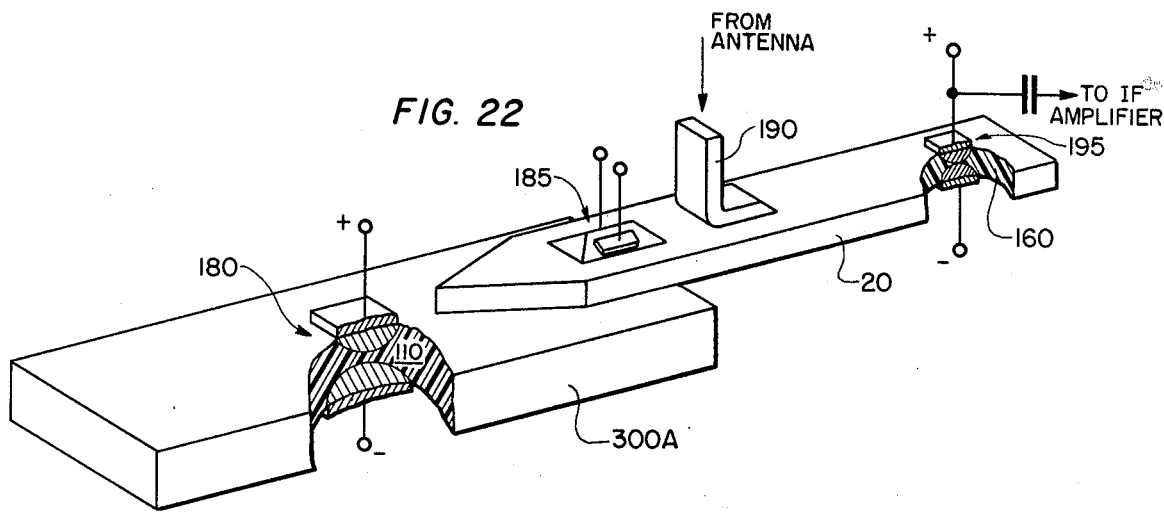

QUASI-OPTICAL INTEGRATED CIRCUITS

BACKGROUND OF THE INVENTION

This is a division of application Ser. No. 397,184, filed Sept. 13, 1973, now U.S. Pat. No. 3,866,143 and a continuation-in-part of our copending patent application, Ser. No. 218,964, filed Jan. 19, 1972 and now abandoned.

At the present time, most microwave integrated circuits are based fundamentally on a microstrip concept which works well in the frequency region from L-band up to X-band, and possible K-band. Above these frequencies, however, the losses become increasingly apparent and the costs rise excessively.

Conventional waveguides propagate energy according to the inside dimensions of the guide. This becomes difficult at the higher microwave frequencies and prohibitively difficult and expensive at millimeter and submillimeter band, that is, at frequencies from about 10GHz to 500GHz, where the dimensions (at least about one half wavelength in the material) must be extremely small. Because of these very small dimensions and the poor tolerances obtainable at the quasi-optical frequencies, energy transmission losses and mode changes can become serious. If, on the other hand, one attempts to use a glass dielectric rod immersed in air or in another dielectric medium, such as has been suggested for the optical band for transmission of millimeter and submillimeter waves, the losses would be very large. Moreover, there is no way in which effectively to control the carrier concentration within a rod made of glass or other amorphous material, and thus, no way to form wave energy transmission control devices right in the waveguiding medium.

SUMMARY OF THE INVENTION

In accordance with the invention, a bulk semiconductor strip of material having a high resistivity — of the order of at least 4000 ohm-cm — is used as a wave propagating medium. A typical example of such an intrinsic material is silicon, which can have a resistivity as high as 25,000 ohm-centimeters; gallium arsenide also is feasible. For such a high resistivity medium which, of course, connotes a high purity or intrinsic semiconductor of low conductivity, the power attenuation, which is an inverse exponential function of conductivity, is substantially negligible in the millimeter and submillimeter frequency range of interest. Experiments have shown that very little loss of quasi-optical wave energy occurs outside the waveguide, provided the usual care is taken to tailor the dimension of the waveguide to the desired frequency range of operation, which, of course, requires that the transverse dimension of the semiconductor strip be greater than approximately one half wavelength in the semiconductor material.

For controlling the propagation of millimeter or submillimeter energy along the intrinsic semiconductor waveguide, the latter can be an intrinsic semiconductor provided on opposite surfaces with grown doped regions of opposite conductivity type, or an undoped intrinsic semiconductor with opposite polarity electrodes on opposite surfaces, so that regions of carrier concentration are formed in the vicinity thereof. By changing the unidirectional biasing potential applied across these oppositely doped regions, or opposite polarity electrodes, as the case may be, the injected carrier concentration in the portion of the intrinsic semiconductor waveguide lying therebetween can be changed, thereby varying the conductivity of the semiconductor and permitting control of either the amount of energy transmitted through, or else the phase shift within, that portion of the semiconductor waveguide, depending upon design considerations, to be mentioned subsequently. This concept therefore, lends itself to amplitude modulators, controlled attenuators, switches, and power dividers or controllable directional couplers, as well as to phase shifters and phase modulators.

If the carriers are injected into a portion of the semiconductor waveguide close to its surface, the phase shift of millimeter or submillimeter wave energy propagating within that portion is influenced. If, on the other hand, the carriers are injected deeper into the aforesaid portion of the semiconductor waveguide structure, the amplitude of the energy passing through that portion is affected. Although there may be some second order phase shifting in the case of the amplitude controlling devices, or some second order amplitude control in phase shifting devices, this can be rendered substantially negligible by proper design. In designing phase shifting devices, it is necessary to consider that the amount of phase shift obtained, at a given frequency, is a function of the length of the electrodes, or of the doped regions, as the case may be.

The phase constant of propagation of millimeter and submillimeter wave energy along the intrinsic semiconductor waveguide can be controlled also by mounting an intrinsic single crystal semiconductor control member to one major surface of the semiconductor waveguide. This control member can have a PN or PIN structure built therein to which can be applied a unidirectional biasing voltage of variable magnitude.

Because the waveguide medium is an intrinsic semiconductor crystal, one can introduce circuit components and devices, such as mixers and detectors, right into the medium, as opposed to strip-line structures and other integrated circuits used at lower frequencies, wherein the circuit currents flow through the external elements of the strip line or circuitry and the ground plane or other return path deposited on the substrate.

A millimeter or submillimeter wave generator can be constructed by growing a negative resistance device, such as an avalanche diode or Gunn diode, right into a semiconductor waveguide of proper geometry to constitute a cavity resonator. The diode, for example, can consist of two highly doped regions of opposite conductivity type disposed within a portion of the waveguide. A biasing or control potential can be connected directly to electroded doped regions of this cavity resonator. Alternatively, a negative resistance electron device can be inserted in an aperture in a cavity resonator structure of a material having high resistivity and dielectric constant and supported therefrom by appropriate mounting means at a distance equal to an integral number of half wavelengths from the resonator boundary.

DESCRIPTION OF THE DRAWINGS

FIG. 4b is a view showing the transition piece for a typical semiconductor waveguide for mounting within the metal waveguide of FIG. 4a;

FIG. 15 illustrates a generator having the negative device mounted in an aperture at the center of a cylindrical cavity resonator coupled to the semiconductor waveguide;

FIG. 16 illustrates a generator having a negative resistance device mounted within an aperture in a toroidal cavity resonator coupled to the semiconductor waveguide;

FIG. 17 is a view of a device using the semiconductor waveguiding medium of FIG. 1 which can be used as a power divider or controllable directional coupler;

FIG. 18 is a view of a directional coupler or power divider using the PIN construction shown in FIG. 3;

FIG. 19 is a view showing a PN detector mounted in a section of an intrinsic semiconductor waveguiding medium;

FIGS. 20 and 21 are views showing a mixer arrangement having a mixer diode mounted at the junction of two intersection semiconductor waveguiding media; and FIG. 22 is a pictorial view showing a receiver front end using certain of the devices already described.

Figure 1:
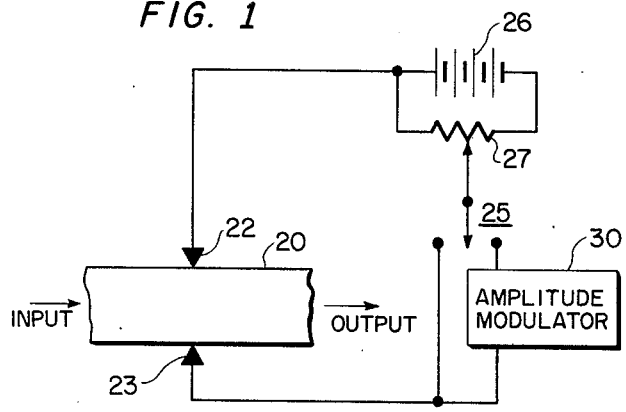
FIG. 1 is a view showing a portion of an amplitude controlling device incorporating an intrinsic semiconductor wave guiding medium having point contact electrodes as a control element disposed on opposite surfaces.
Figure 2:
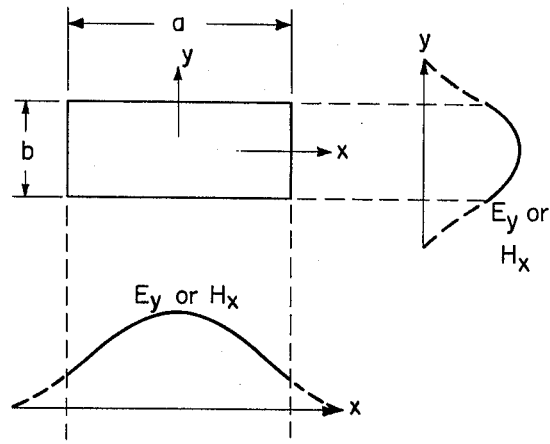
FIG. 2 illustrates a typical field configuration for the fundamental mode of the wave guiding medium of FIG. 1.

The device of FIG. 1 is particularly adapted for amplitude control and incorporates an intrinsic single crystal semiconductor waveguide 20 shown with arrows and legends indicating the direction of propagation of the energy. In devices, such as that of FIG. 1, wherein the semiconductor waveguide 20 is of rectangular cross section of width $a$ and height $b$ (see FIG. 2), the mode exhibiting the lowest loss is the $E_{11}^y$ mode. The distribution of the E and H fields in both the $x$ and $y$ directions (directions mutually transverse to the $z$ direction along which the millimeter or submillimeter wave energy propagages) is shown in FIG. 2 and falls off exponentially at a rate dependent upon the wavelength and the dielectric constant of the waveguide. It will be noted that an evanescent E and H field exists beyond the physical boundaries of the waveguide structure. Point contact electrodes 22 and 23 contact opposite major faces of waveguide 20 substantially midway along the transverse ($a$) dimension thereof, assming operation in the fundamental $E_{11}^y$ mode. When the arm of switch 25 is in the left hand position, a suitable biasing or control potential from variable unidirectional voltage source 26 is applied across electrodes 22 and 23, and a high level electric field is concentrated in a narrow region of the semiconductor waveguide 20 disposed immediately between the two point contact electrodes. This electric field causes a concentration of carriers in this very narrow region between point contacts, with a resulting change in conductivity of the waveguide 20 in this region. By adjusting the magnitude of the control voltage, as by potentiometer 27, the carrier concentration can be changed in proportion. As the biasing voltage is increased, the carrier concentration increases, and the conductivity of the narrow region of the semiconductor waveguide increases; consequently, attenuation of the wave energy propagating in the waveguide 20 increases. If the voltage is made sufficiently large, the carrier concentration can be made so high as to block completely transmissions of the input wave energy past the region lying between the electrodes 22 and 23; in other words, the device acts as a switch. When the arm of switch 25 in FIG. 1 is moved to the right hand position, the energy can be amplitude modulated by the amplitude modulation signal from amplitude modulator 30. The percentage of amplitude modulation will depend, of course, upon the level of the modulating signal, and also, of course, upon the biasing level.

Figure 3:
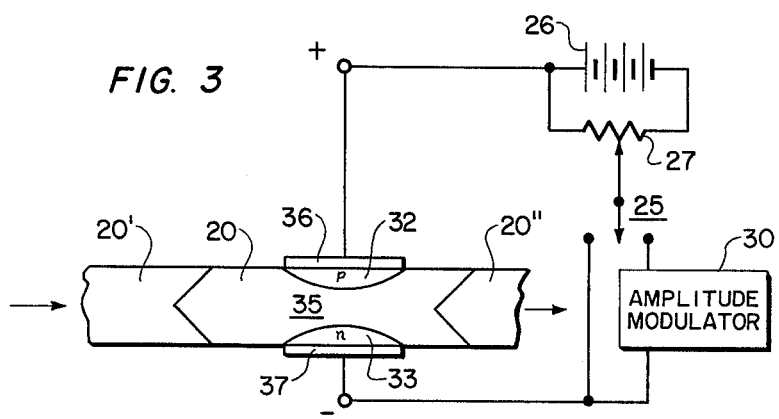
FIG. 3 is a view of an amplitude controlling device wherein the control element is formed within the semiconductor wave guiding medium.

In contrast with the device of FIG. 1, wherein a conrol or biasing potential is applied to electrodes on opposite surfaces of the substantially intrinsic semiconductor waveguide, the device of FIG. 3, which also can be of rectangular cross section, as indicated in FIG. 2, has doped regions 32 and 33 of opposite conductivity type formed, as by diffusion or implantation, into the opposite surfaces of the waveguide. The p region 32 and n region 33, together with the portion of the intrinsic semiconductor waveguide 20 lying therebetween, constitutes a PIN diode structure 35. When a forward biasing potential from source 26 is applied to the diode, electrodes 36 and 37, the degree of carrier concentration in the portion of the waveguide 20 disposed between the juxtaposed doped regions 32 and 33 is increased. The doped regions provide a built-in source of free carriers and thus regions of greater conductivity than the remainder of the semiconductor waveguide 20. On the other hand, the device of FIG. 1 has no free carriers, in the absence of a control potential.

The ends of the semiconductor waveguide 20 are shown tapered in the event that it is to be connected to other waveguide sections 20' and 20''. The latter sections may be of the same material as waveguide 20 or may, for example, be waveguides with different dielectric constant.

The configuration of the taper of the waveguide 20 shown in FIG. 3 is a reasonably close approximation to an exponential taper which allows for most efficient impedance transformation between waveguide sections 20' and 20'' and waveguide 20. In practice, the length of the tapered portion is about 5 half wavelengths. The sections 20' and 20'' can be joined to waveguide 20 by a low-loss adhesive, or simply by frictional contact. The sections 20' and 20'' may even by separated very slightly, provided the separation is very small compared to one wavelength. It should be understood that the sections 20' and 20'' need not be used, and that the entire quasi-optical wave propagating medium need consist only of one waveguide 20.

The device of FIG. 3 can be operated as an attenuator when the switch arm 25 is in the left hand position. The positive terminal of the voltage source 26 is connected to the electrode 36 contacting the p type region 32, while the negative terminal is connected to the electrode 37 contacting the n type region 33. A potentiometer 27 connected across the voltage source 26 allows for variation of the control or biasing voltage, as in the device of FIG. 1. Because of the forward bias on the PIN structure 35, carriers are injected into the portion of the semiconductor waveguide 20 disposed between doped regions 32 and 33, thereby increasing the conductivity of that portion of the semiconductor waveguide and attenuating the energy propagating along the waveguide, in accordance with principles already discussed.

The device of FIG. 3 can be used as a switch by leaving the switch setting as just described and increasing by potentiometer 27 the forward bias level across the PIN junction diode 35 until all the incoming energy is reflected at the PIN junction and none reaches the output (load) end of the waveguide. The switching (binary or on-off operation) could be achieved by replacing the potentiometer sliding tap with two selectable fixed taps positioned so as to pick off control voltages which are either above or below that required for total reflection of energy at the PIN junction.

Amplitude modulation of the millimeter or submillimeter wave energy propagating along the semiconductor waveguide 20 can be achieved by moving the switch 25 of FIG. 3 to the right hand side and thereby introducing the amplitude modulating signal from amplitude modulator 30.

In the device of FIG. 3, the doped regions 32 and 33 provide regions of carrier concentration, even in the absence of a bias potential, and, hence, these regions are of higher conductivity than that of the undoped remaining portion of the semiconductor waveguide. Application of a forward bias to these doped regions results in a relatively large supply of carriers in the portion of the intrinsic semiconductor waveguide lying between the doped regions, which, at sufficiently high levels of control voltage, is sufficient to flood the entire region of the semiconductor waveguide lying between these doped regions.

Figure 4A:
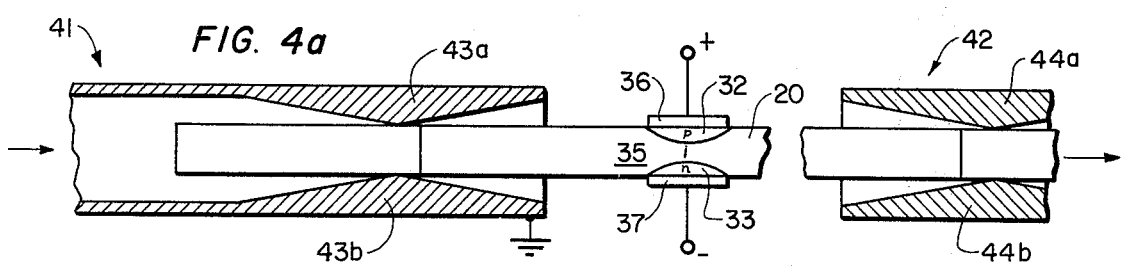
FIG. 4a is a view showing a device similar to FIG. 3 mounted within a metal waveguide.
Figure 4B:

In some applications it is advantageous to use the semiconductor waveguide 20 in conjunction with metal waveguides. FIG. 4 illustrates the manner in which the intrinsic semiconductor waveguide 20 can be mounted within metal waveguides 41 and 42. The semiconductor waveguide 20 can be inserted within the larger metal waveguide since the dielectric constant of the semiconductor waveguide is much higher (for example, $\epsilon = 12$ for silicon). The semiconductor waveguide 20, into which a diode 35 can be formed, is tapered at both ends. One end of the semiconductor waveguide 20 is inserted between opposed tapered portions 43a and 43b of the metal waveguide 41 and the opposite end of semiconductor slab 20 is mounted within the metal waveguide 42 between the juxtaposed tapered portions 44a and 44b thereof. Each of the tapered end portions of the semiconductor waveguide 20 are of the order of 5 half wavelengths long. By means of the launching means shown in FIG. 4a, the impedance of the metal waveguide can be matched effectively to the impedance of the semiconductor waveguide. The device 35 of FIG. 4 has spaced p and n regions 32 and 33 formed within the semiconductor waveguide 20. When metal waveguide sections are used, one terminal of the biasing source can be connected directly to some point on the metal waveguide. In one embodiment the semiconductor waveguide 20 was 6 millimeters wide, 3 millimeters high and about 10 centimeters long. In the submillimeter wave region, where semiconductor waveguide dimensions become relatively small, the semiconductor waveguide 20 can be fabricated by photoetching or ion implantation into the semiconductor substrate of high resistivity. With these techniques, which can include masking for achieving appropriate dimensions of the semiconductor waveguide, the waveguide 20 so formed within the substrate would have a higher dielectric constant than that of the substrate, so as to properly confine the energy along the waveguide 20.

Figure 5:
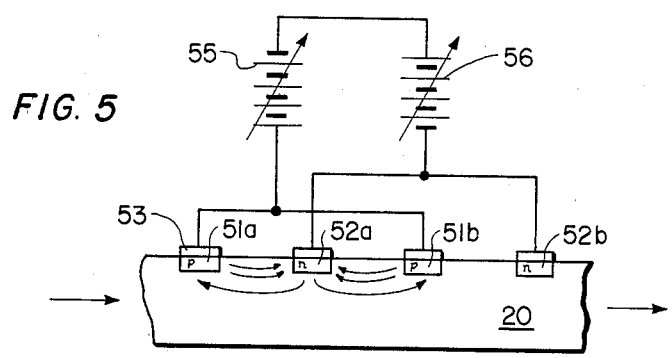
FIG. 5 is a view of a phase shifter having a plurality of forward-biased p and n doped regions formed near one major surface of the semiconductor wave guiding medium.

A phase shifter is shown in FIG. 5 and includes an intrinsic semiconductor 20 which has a plurality of p type doped regions 51a, 51b, etc. and a like plurality of n type doped regions 52a, 52b, etc. formed near one major surface of the semiconductor waveguide 20. The alternate regions 51 and 52 of opposite conductivity type are maintained at opposite polarity by being connected to oppositely polarized power supplies 55 and 56, as shown in FIG. 5. The necessary electrical connections are made to electrodes 53 which may be thin metallic layers formed on the surfaces of the doped regions by any of the usual integrated circuit techniques. A given p type doped region, such as region 51, the adjacent n type doped region 52, and the portion of the intrinsic semiconductor waveguide 20 lying therebetween combine to form a forward-biased PIN diode. Carriers thus are injected into the semiconductor with the hole and electron migration being shown by the arrows. Thus, a region of changing conductivity is produced at or near the surface of the waveguide between the various doped regions, whereby the millimeter or submillimeter wave energy propagating along the semiconductor waveguide can be made to undergo a phase shift in the region occupied by the various PIN diode. If the carrier lifetime is sufficiently short and if the doped regions are sufficiently closely spaced, a substantial portion of the carriers will remain along paths near the surface, as shown by the arrows in FIG. 5. The number of carriers traveling into the semiconductor perpendicular to the major surfaces will be relatively few and there will be little carrier absorption or attenuation. This device provides phase shift with little or no attenuation.

Modifications of the phase shifter device of FIG. 5 are shown in FIGS. 6 to 9, wherein a thin intrinsic single crystal semiconductor member or appendage 200 which includes control means, such as a biased diode, is mounted on one of the major surfaces of the semiconductor waveguide 20. Some of the energy propagating along the waveguide 20 is coupled into the semiconductor appendage. The appendage 200 can be provided with slant end faces in order to improve matching between the semiconductor waveguide 20 and the appendage 200.

Figure 6A:
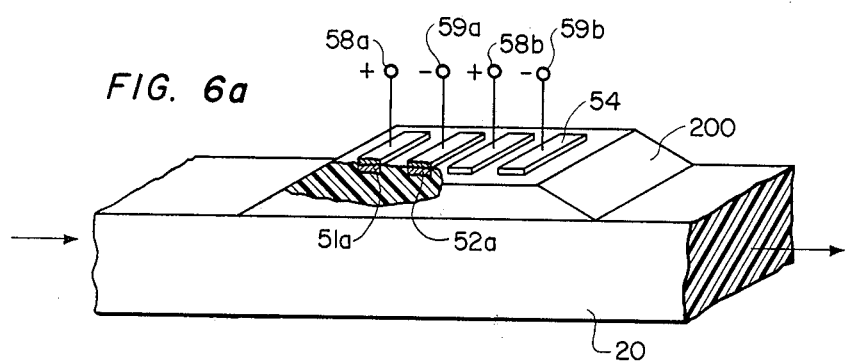
FIGS. 6a and 6b are views illustrating an embodiment of phase shifter having an intrinsic semiconductor appendage of rectangular cross section mounted on the semiconductor waveguiding medium and having formed therein doped regions which partially comprise one or more control diodes.
Figure 6B:
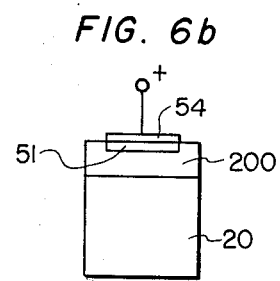

In the device of FIGS. 6a and 6b, a plurality of spaced transverse alternating p type regions 51 and n type regions 52 are formed within the appendage 200. The transverse regions 51 and 52 are shown to be shorter than the transverse dimension of appendage 200; these regions, however, can extend the entire width of the appendage. Since the electric field is a maximum at or near the center of the waveguide appendage 200, the largest control occurs at the center of the lateral dimension of the waveguide appendage. The phase shift will be a function of the number of such doped regions and of the magnitude of the bias voltage applied thereto. As in the device of FIG. 5, the p and n type regions 51 and 52 are in contact with electrodes 54 which are connected to positive and negative terminals 58 and 59, respectively of a unidirectional power supply; in other words, the PIN diodes formed by adjacent p and n regions and that portion of the intrinsic semiconductor of the appendage lying therebetween, are forward biased. The carriers are injected along paths within the appendage similar to those shown in FIG. 5. Because of the crystal interface or boundary between the appendage 200 and the waveguide 20, none of the carriers can pass down into the depths of the waveguide and cause undesirable attenuation to occur in the phase shifter.

Figure 7A:
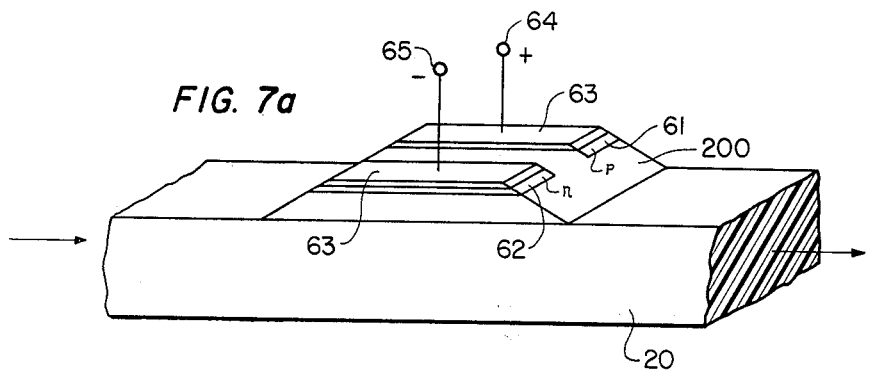
FIGS. 7a and 7b are views illustrating a phase shifter wherein the doped regions of the semiconductor appendage of rectangular cross section are elongated regions extending along the direction of propagation of energy.
Figure 7B:
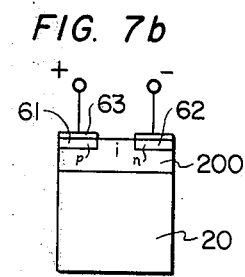

Another type of phase shifter is shown in FIGS. 7a and 7b in which the appendage 200 attached to the waveguide 20 includes a pair of longitudinal p and n type regions 61 and 62 formed in the upper surface of the appendage 200 along opposite sides thereof; these doped regions 61 and 62 are spaced apart by an intrinsic region which merges into a wider region (see FIG. 7b) which can extend across the appendage. When the PIN diode formed by the p and n strips or regions 61 and 62 and the inverted T-shaped intrinsic region is forward biased by connecting the electrodes 63 contacting regions 61 and 62 to the positive and negative terminals 64 and 65, respectively, carriers are injected into the intrinsic region along paths generally transverse to the direction of propagation of wave energy, thereby changing the conductivity of the latter region. If the forward bias voltage is increased, the effective height of the semiconductor waveguide 20 over the portion thereof juxtaposed to the appendage 200 is increased. This results in a decrease in effective guide wavelength in said portion and an increase in phase shift of energy propagating along the waveguide 20.

Figure 8A:
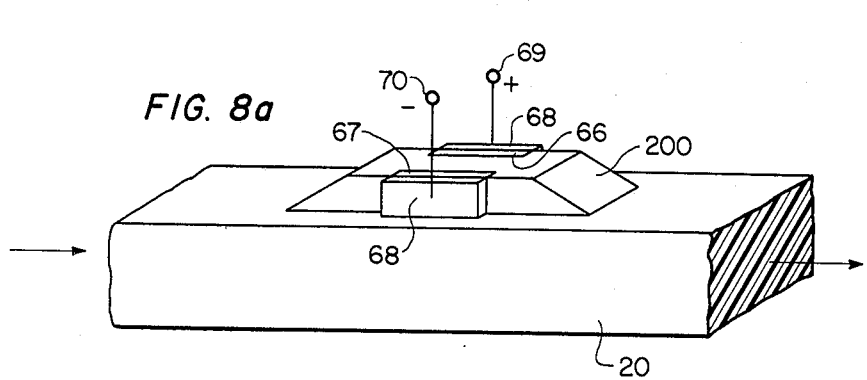
FIGS. 8a and 8b are views illustrating a phase shifter wherein the doped regions of the semiconductor appendage of rectangular cross section are arranged along the sides of the appendage.
Figure 8B:
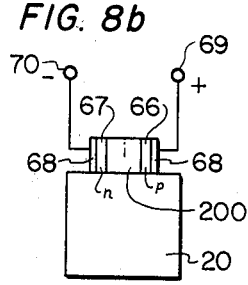

Still another version of a phase shifter is shown in FIGS. 8a and 8b, in which the p and n doped regions 66 and 67 are formed along the sides of the appendage 200. These doped regions are connected by the electrodes 68 to positive and negative terminals 69 and 70, respectively. The general direction of movement of the injected carriers into the intrinsic region is transverse to the direction of propagation of wave energy, as in the device of FIGS. 7a and 7b The doped regions need not extend to the surface of the waveguide; however, as the doped regions of the appendage become closer to the waveguide 20, the phase shift is somewhat enhanced, other parameters remaining constant.

Figure 9A:
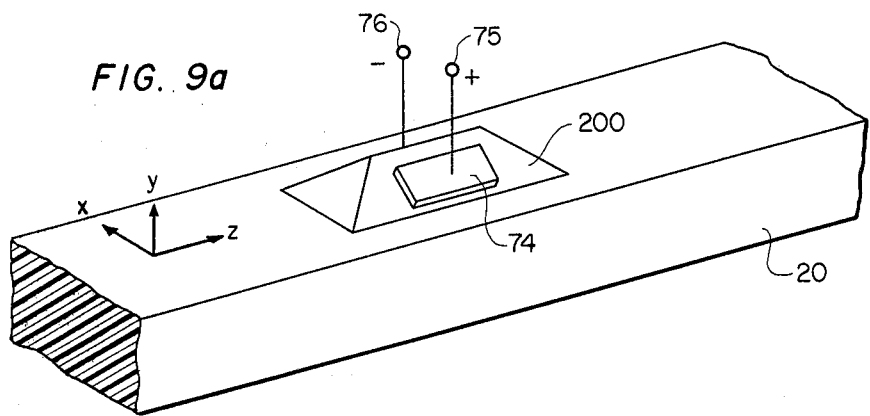
FIGS 9a and 9b are views illustrating a phase shifter wherein the semiconductor appendage is of triangular cross section, with FIG. 9b also illustrating a typical distribution of the component of the electric field in the direction of the height of the semiconductor waveguide for different conditions of control bias.
Figure 9B:
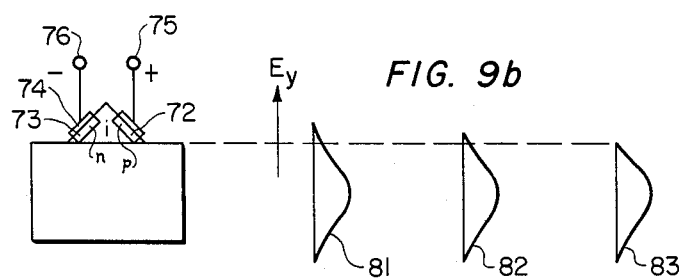

In the electronic phase shifter of FIGS. 9a and 9b, the semiconductor diode appendage 200 is of triangular cross section with the p and n doped regions 72 and 73 formed in the slanting sides of the appendage. As in the devices previously described, forward forwardd bias is applied to the PIN diode formed within the appendage 200 by connecting the electrodes 74 contacting p and n doped regions 72 and 73 to the positive and negative terminals 75 and 76, respectively, of the unidirectional bias voltage source. When the bias voltage is small, the carriers are concentrated in the limited region near the apex of the triangular region. Because of the increased conductivity of the appendage in this limited region, the effect is that of a small electrode positioned near the apex of the triangular appendage. As the dc bias potential is increased, the proportion of the triangular intrinsic semiconductor occupied by free carriers increases, until finally, the whole volume of the appendage lying between the doped regions 72 and 73 becomes substantially filled with free carriers. As the region of higher conductivity in the triangular appendage progressively approaches the upper surface of semiconductor waveguide 20, the field distribution along the waveguide changes. The distribution of $E_y$, the component of the electric field in the $y$ direction, in the absence of bias, is shown by the curve 81 in FIG. 9b. It will be noted that, as in FIG. 2, there is an evanescent field extending exponentially beyond the confines of the waveguide and the maximum exists at a plane forming midway between the top or bottom surfaces of the waveguide 20. As the control voltage increases, the volume of carrier concentration increases and the plane of high conductivity approaches the surface of the dielectric waveguide. This, in effect, causes a spread in the distribution of the component $E_y$ of the electric field shown in FIG. 9b, thereby decreasing $k_y$, the phase constant in the $y$ direction; this condition is shown by the curve 82 in FIG. 9b. The result of such a change is that the phase constant in the $z$ direction which is given by $$k_z = [k_1{}^2 - k_x{}^2 - k_y{}^2]^{1/2}$$

where $$k_1 = \frac{2\pi \sqrt{\epsilon}}{\lambda \text{ air}}$$

is increased. The wavelength $\lambda_z$ in the direction of propagation, which is equal to $2\pi/k_z$, thus decreases. At a still higher value of bias, the conductive plane (the lower limit of the conducting volume) approaches the top surface of the semiconductor waveguide 20, as indicated by the curve 83, forming an image plane at said surface. At this point, $k_y$ is a minimum and $k_z$ is a maximum and $\lambda_z$ approaches a minimal value. In summary, the effective guide wavelength decreases as a function of the magnitude of the forward direct current bias potential applied to the PIN diode.

Figure 10:
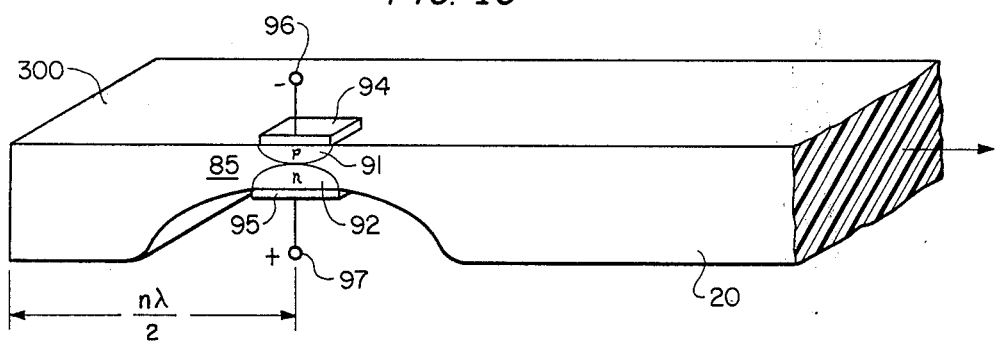
FIG. 10 is a view showing a generator comprising a negative resistance device formed within a portion of a semiconductor waveguiding medium which is of such geometry as to constitute a cavity resonator.

An example of an integrated circuit millimeter or submillimeter wave generator is shown in FIG. 10 in which a negative resistance device 85 is made up of contacting p+ and n doped regions 91 and 92 and formed right into an intrinsic single crystal semiconductor medium which constitutes both a cavity resonator 300 and a semiconductor waveguide 20 which is of reduced cross section and thus of thickness consistent with fabrication requirements for such PN diodes. Impedance matching between the PN diode 85 and the portions of the semiconductor medium on either side thereof can be achieved by tapering the cross section, as shown in FIG. 10. The PN diode 85, which can be an avalanche or Impatt diode, in which the region 91 is more heavily doped than region 92, is disposed an integral number of half wavelengths, at the operating frequency, from one end of a semiconductor resonator 200. The negative resistance diode 85 and the portion of the semiconductor medium lying between the diode 85 and the free end of the semiconductor medium constitutes the cavity resonator 300. The p and n conductivity type regions 91 and 92 are provided with respective ohmic contacts 94 and 95 to which are attached negative and positive terminals 96 and 97, respectively, of a unidirectional bias supply for establishing the proper operating mode for the diode 85. In the oscillator device of FIG. 10, as well as in the oscillator devices of FIGS. 11, 13 and 14, a reverse bias is applied to the diodes. In the case of the Gunn diode oscillator in a GaAs guide of FIG. 12, the bias polarity can be as indicated in FIG. 12.

Figure 11:
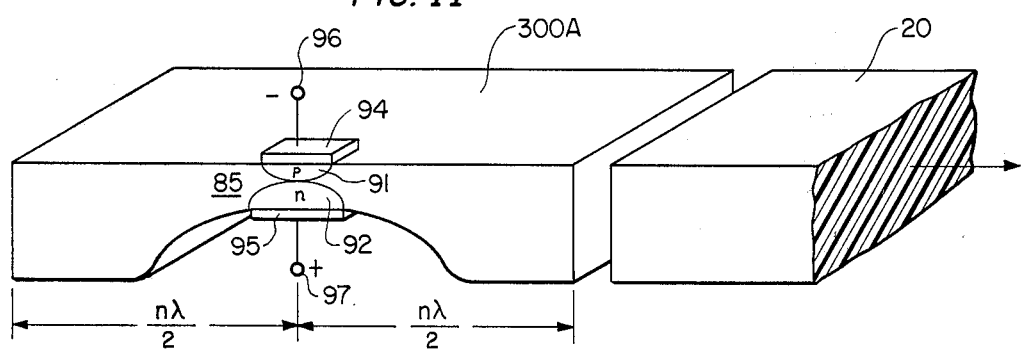
FIG. 11 illustrates a generator similar to that of FIG. 10 except that cavity resonator is spaced from, and in line with, the waveguiding medium to which energy is coupled by way of an air gap.

An alternative arrangement is shown in FIG. 11 wherein the diode 85 is disposed at a point midway-between the ends of semiconductor resonator 300A an integral number of half wavelengths (that is $n\lambda/2$), where $n$ is any integer and $\lambda$ is the wavelength, from each end thereof. It should be noted that the integer $n$ need not be the same for both sides of the resonator; that is, the diode 85 need not be at the midpoint of the resonator structure 300A, so long as the distance $n\lambda/2$ is maintained. The arrangement of FIG. 11 is such that coupling of generated energy from the cavity resonator 300A to the waveguide 20 is achieved through a small space therebetween.

Figure 12:
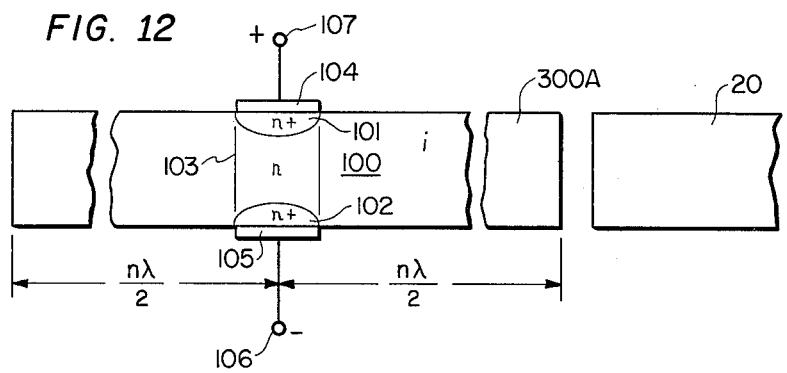
FIG. 12 illustrates a generator coupled to a semiconductor wavegude as in FIG. 11 wherein the negative resistance device is a Gunn diode.

In the device of FIG. 12, a Gunn diode 100 is mounted a distance $n\lambda/2$ from each end of the cavity resonator 300B. The Gunn diode 100 consists of two heavily doped n conductivity type regions 101 and 102 formed within the resonator 300A which contact a less heavily doped n conductivity type central region 103. The electrodes 104 and 105 contacting the respective n+ regions 101 and 102 are connected to negative and positive terminals 106 and 107 respectively of a unidirectional control voltage supply. The energy generated in resonator 300B can be coupled to the semiconductor waveguide 20 as in the device shown in FIG. 11.

Figure 13:
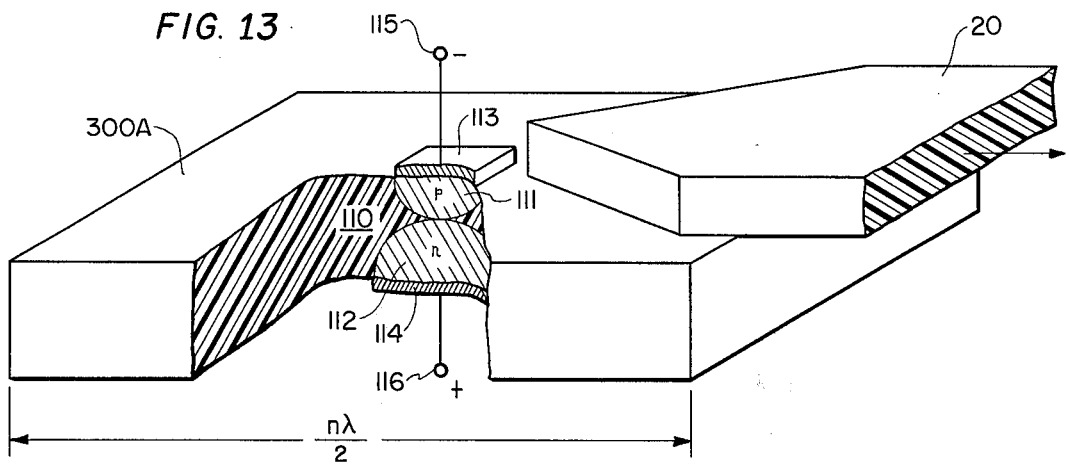
FIG. 13 illustrates a generator similar to that of FIGS. 10 and 11 but using a PN diode and having the semiconductor waveguide mounted on the cavity resonator for coupling purposes.

The device of FIG. 13 differs from those shown in FIGS. 10 and 11 in the method of coupling of energy into the semiconductor waveguide 20. The semiconductor waveguide 20 of FIG. 13 is mounted directly on top of the cavity resonator 300A, instead of being arranged in line therewith (FIG. 11) or integral therewith (FIG. 10). The PN diode 110 of FIG. 13 includes p and n doped regions 111 and 112 connected by electrodes 113 and 114 to negative and positive bias voltage terminals 115 and 116, all respectively. The device of FIG. 13 is an avalanche negative resistance device.

It should be understood that the methods of coupling shown in FIGS. 10, 11, and 13, the types of cavity resonators shown in FIGS. 10 and 11 and the types of diodes shown in FIGS. 10, 12 and 13 can be used interchangeably with one another.

Figure 14:
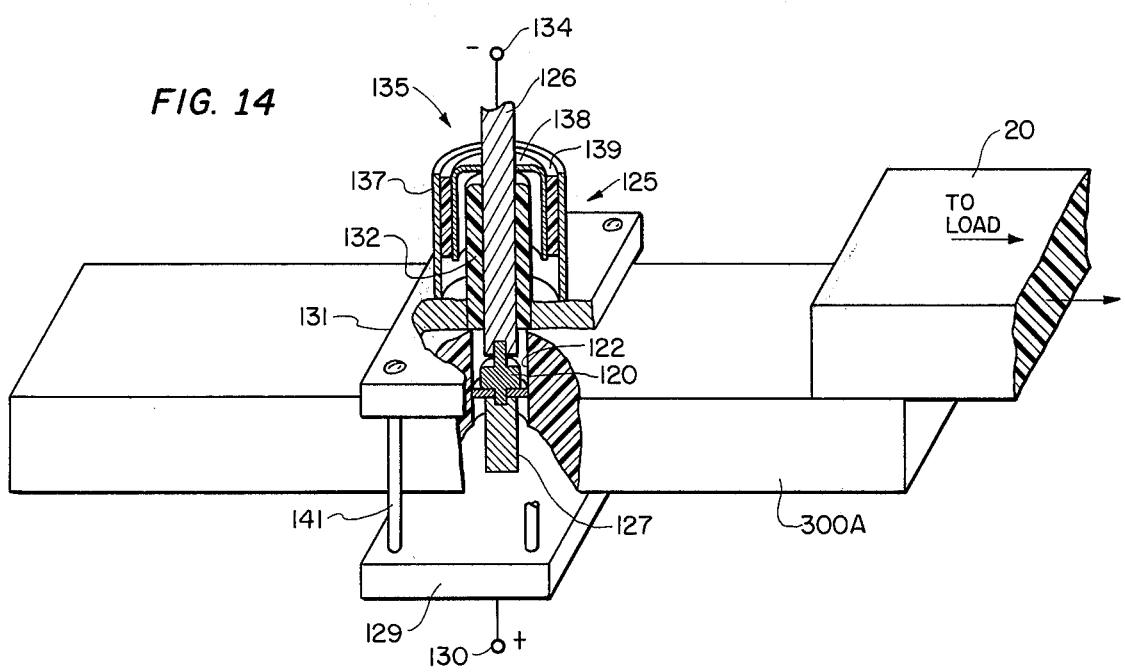
FIG. 14 illustrates a generator similar to that of FIG. 13 but with the negative resistance device mounted in an aperture within the cavity resonator.

In FIG. 14, a negative resistance device 120, such as an avalanche or Impatt diode, a Gunn diode, or TRAPATT device, is inserted within an aperture 122 in the cavity resonator 300A. The cavity resonator of FIG. 14 is a bar of rectangular cross section which can be made for example, of high resistivity silicon.

Gallium arsenide and aluminum oxide, or any other material having low conductivity and a high dielectric constant can be used. In other words, if the negative resistance device is inserted within an aperture in the cavity resonator, instead of being grown therein, the resonator material need not be a single crystal intrinsic semiconductor. The negative resistive oscillator diode 120, of FIG. 14, can be mounted to the resonator 300A by a mounting assembly 125 including upper and lower metal posts 126 snd 127, respectively, each including split finger contacts for gripping the diode 120. The lower metal mounting post 127 can be integral with, or attached to the lower plate 129 which can be connected to a positive terminal 130 of a unidirectional control voltage source. The mounting assembly 125 includes an upper plate 131, and an insulating bushing 132 to provide electrical insulation from the positive voltage supply, since the upper metal post 126 is connected to a terminal 134 of negative potential. An r.f. choke 125 for isolating high frequency energy from the dc power supply which is connected to the upper metal mounting post 126 includes cylindrical member 137, cup-shaped member 138 and insulating member 139. The lower and upper plates 129 and 131 are interconnected by long screws 141 which can be tightened sufficiently to hold the negative resistance diode 120 in place within the aperture 122 in the resonator 300A. No metal exists around the outside portion of the structure so that radiation can occur directly from the body of the diode 120 out to the dielectric waveguide cavity resonator 300A. The diode 120 is mounted in the cavity resonator 300A to be any integral number of half wavelengths, at the oscillation frequency, from the ends of the cavity resonator. To couple the power out from the resonator, the dielectric waveguide 20, whose cross sectional dimensions can be similar to those of the cavity resonator 300A, is positioned on top of one end of the cavity resonator. The coupling length is adjusted for maximum power transfer from the resonator into the dielectric waveguide 20. The methods of coupling shown in FIG. 11 also can be used with the device of FIG. 14; furthermore, the diode 120 can be mounted in a manner indicated in FIG. 10. By way of example, a Gunn diode inserted in a cylinder cut in the silicon guide was mounted in a silicon semiconductor waveguide 3 millimeters by 6 millimeters and 10 centimeters long was found to oscillate at 15GHz with more than 20 milliwatts output.

FIG. 15 illustrates an oscillator wherein the negative resistance diode, not visible in FIG. 15, is positioned within a central aperture 122 of a radial cavity resonator 300B. The radial cavity resonator, like the parallel-opiped cavity resonator 300 of FIG. 10 and 300A of FIGS. 11–13, is made of a semiconductor of high resistivity, such as silicon. The diode is mounted between upper and lower mounting posts 126 and 127, as in the device of FIG. 14. The radius of the radial cavity resonator 300B of FIG. 11B is substantially any number of half wavelengths at the oscillator operating frequency. The radial current flow is a maximum, and the impedance a minimum, at the center and at the edge of the resonator. In one illustrative embodiment of the device of FIG. 15, a silicon disc was 3mm in height and radius of roughly 1cm was used to provide oscillations at 15GHz. Energy in the radial cavity resonator 300B is coupled into the semiconductor waveguide 20 through a small air gap. In FIG. 15, a flat metal plate 145 is shown placed on the bottom of the cavity resonator 300B for heat dissipation; this metal plate 145 also has the effect of causing a slight change in wavelength in the radial cavity resonator owing to an action similar to that described in FIG. 9. It should be noted, however, that the oscillator system of FIG. 15 will operate satisfactorily with or without the bottom plate and will depend primarily on the dimensions of the cavity resonator.

Another version of the oscillator system is shown in FIG. 16 which uses a toroidal cavity resonator 300C which can be suitably machined from a block of silicon, or other high resistivity semiconductor material. An aperture 122 is cut in the toroidal cavity resonator 300C for receiving the negative resistance diode, as in previous cases. The diode can be mounted by mounting posts 126 and 127 in a manner to that described in connection with the device of FIGS. 14 and 15. Because of the low loss (little or no metal being present) high Qs are possible in both the millimeter region and submillimeter regions of the spectrum. This means circumference of the toroidal cavity resonator 300C is substantially any integral number of half wavelengths at the operating frequency of the resonator. Coupling of energy from the toroidal cavity resonator 300C to the waveguide 20 can be obtained by positioning the waveguide adjacent to the ring resonator. In all cases, the systems shown in FIGS. 14 to 16, tuning can be accomplished by electronically varying the wavelength in the material by means of an electronic phase shifter, such as previously described.

The principles already discussed in connection with FIGS. 1 and 2 can be used to construct a controllable directional coupler or power divider, as indicated in FIG. 17. The directional coupler or power divider may comprise a bifurcated semiconductor slab 20' having a first arm 20A and a variable attenuator built into arm 20B. The input wave energy will divide in proportion to the relative areas of the coupled portions of the semiconductor waveguide and the entire waveguide 20' in the absence of any direct current bias on electrodes 22 and 23. As the bias from the direct current source 26 is increased, the losses in the coupler arm 20B increase, for reasons already explained in connection with FIG. 1, and the ratio of output energy in arm 20B to that in arm 20A decreases.

The use of a PIN diode in a directional coupler or power divider 20' is illustrated in FIG. 18. The PIN diode 35, like that shown in FIG. 3, is made up of a p type region 32 and an n type region 33 and the portion of intrinsic semiconductor arm 20B lying therebetween. The portion of the wave energy entering the output arm 20B depends upon bias from source 26 applied to the PIN diode 35 formed in the control arm 20B. This bias can be varied by adjustment of potentiometer 27 to adjust the ratio of the magnitude energy emanating from arm 20B to that entering a coupler. The operation of such a directional coupler device is basically identical to that with the PIN diode of FIG. 3.

The semiconductor waveguide 20 of FIG. 19 has a PN diode detector 155 mounted therein which can comprise juxtaposed p and n conductivity regions 151 and 152 formed by doping into the intrinsic semiconductor 20. Ohmic contacts 153 and 154 which are evaporated or otherwise attached to the respective p and n regions 151 and 152 serve as positive and negative terminal connections to 156 and 157 of a unidirectional control (bias) voltage source. The detector 155 should be positioned an odd number of quarter wavelengths from the end of the semiconductor waveguide 20. The ends of the semiconductor waveguide 20 of FIG. 19 is shown tapered in order to allow easier fabrication of the diodes (see comments made in regard to the device of FIG. 10).

A mixer arrangement is illustrated in FIGS. 20 and 21, with the energy from two separate energy sources, such as the signal and local oscillator supplying millimeter or submillimeter wave energy to the mixer diode 160 along two separate semiconductor waveguides 20C and 20D, respectively, as illustrated by arrows in FIG. 21. The diode 160 can be formed in a region, preferably of reduced thickness, at the intersection of the two waveguides 20C and 20D, as indicated in FIGS. 20 and 21 and may consist of conjoined p and n conductivity type regions 161 and 162 connected by ohmic contacts 163 and 164 to the positive and negative terminals 165 and 166 of a unidirectional bias voltage supply 26 in series with load 170. It should be noted that the mixer diode of FIGS. 21 and 22 can also be a PIN device such as shown in the detector of FIG. 19.

FIG. 22 discloses a typical combination of several features of the invention which can be used as a quasi-optical energy receiver. The local oscillator 180 consists of a negative resistance device, formed within the semiconductor cavity resonator 300C, such as PN diode 110 in resonator 300A of FIG. 13, which can be coupled, as in the case of FIG. 13, to the semiconductor waveguide 20. A phase shifting device 185, which can be similar to that shown in FIGS. 9a and 9b, can be placed as an appendage to the waveguide 20 for controlling the wavelength, and, therefore, the phase shift in the cavity resonator 300A. The use of this phase shifter, of course, is optional, depending on system requirements. Energy from the receiver antenna can be supplied, along with local energy, to a mixer 160 by way of the directional coupler 190, which is made of a bent section of intrinsic single crystal semiconductor material. The mixer 195 can be a diode 160 such as that shown in FIG. 20 and preferably spaced an odd number of quarter wavelengths from the end of waveguide 20. The output of the mixer 195 can be coupled to the i.f. amplifier of the receiver, which itself could be formed within the semiconductor waveguide 20.

Obviously, many modifications and variations of the present invention are possible. The scope of the invention is limited only in the manner defined by the claims.

What is claimed is:

1. In combination, a quasi-optical energy waveguide consisting entirely of a bulk single crystal intrinsic semiconductor waveguiding medium of high resistivity for propagating millimeter and submillimeter wave energy in the fundamental mode, at least one electrical circuit element disposed at a portion of said medium, and wave energy propagation control means including means for supplying a unidirectional forward biasing voltage to said element for controlling the propagation through said medium of said wave energy in response to conductivity variations produced within said portion of said medium.

2. The combination of claim 1 wherein said circuit element includes a pair of juxtaposed electrically conductive point contact electrodes mounted on opposite surfaces of said portion of said medium and wherein said electrodes are connected across said voltage supply.

3. The combination of claim 2 wherein said unidirectional voltage is a forward biasing voltage.

4. The combination of claim 1 wherein said circuit element includes juxtaposed doped regions of opposite conductivity type formed within opposite major surfaces of said portion of said medium and wherein said doped regions are connected across said supply voltage.

5. The combination of claim 4 further including means for supplying an amplitude modulating signal in series with said supply voltage to amplitude modulate the energy propagating along said medium.

6. The combination of claim 4 wherein said unidirected voltage is a forward biasing voltage.

7. The combination of claim 1 wherein said circuit element includes an electrically conductive member positioned adjacent said portion of said medium and connected to said supply voltage means, said semiconductive member being spaced from said medium by an electrically insulating means.

8. The combination of claim 1 wherein said element includes a plurality of spaced doped regions of alternating opposite conductivity type formed within said medium near one surface thereof and wherein said doped regions of opposite conductivity type are connected to portions of said supply voltage means of opposite polarity.

9. The combination of claim 1 wherein said waveguiding medium contains a plurality of branches only one of which is subject to said wave energy propagation control means.

10. The combination of claim 4 wherein said electric circuit element is a detector of quasi-optical wave energy.

11. The combination of claim 1 further including a detector of quasi-optical wave energy formed within said medium.

12. The combination of claim 1 wherein said waveguiding medium contains a plurality of intercoupled branches each receptive of quasi-optical wave energy from separate sources and wherein said electrical circuit element is a mixer formed within said media at the region of intercoupling.

13. In combination, a waveguiding medium for propagating quasi-optical wave energy, an appendage mounted on a portion of said medium, said waveguiding medium and said appendage each consisting entirely of a bulk single crystal intrinsic semiconductor of high resistivity and high dielectric constant, at least one electric circuit element formed within said appendage and wave energy propagation control means including means for supplying a unidirectional voltage to said element for controlling the propagation through said medium of said wave energy in response to conductivity variations produced within said appendage.

14. The combination of claim 13 wherein said waveguiding medium and said appendage is substantially of rectangular cross section.

15. The combination of claim 14 wherein said circuit element includes spaced elongated doped regions of opposite conductivity type formed within said appendage along opposed edges of the exposed major surface of said appendage and wherein said doped regions are connected across said supply voltage.

16. The combination according to claim 14 wherein said circuit element includes spaced doped regions of opposite conductivity type formed within said appendage along opposite sides of said appendage and wherein said doped regions are connected across said supply voltage.

17. The combination of claim 13 wherein said waveguiding medium is substantially rectangular cross section and said appendage is of substantially triangular cross section, and wherein spaced doped regions of opposite conductivity type are formed in the slanting exposed surfaces of said appendage and wherein said doped regions are connected across said supply voltage.

18. The combination of claim 14 wherein said circuit element includes a plurality of transversely disposed spaced doped regions of alternating opposite conductivity type formed within said appendage near one surface thereof and wherein said doped regions of opposite conductivity type are connected to portions of said supply voltage means of opposite polarity.

19. The combination of claim 13 further including at least one active circuit device formed within said medium.

* * * * *